(12) United States Patent
Huang

(10) Patent No.: US 7,075,322 B2
(45) Date of Patent: Jul. 11, 2006

(54) TESTING APPARATUS WITH ELECTRONIC CAMERA

(75) Inventor: Mao-Yuan Huang, Miao-Li (TW)

(73) Assignee: Innolux Display Corp., Miaoli (TW)

( * ) Notice: Subject to any disclaimer, the term of this patent is extended or adjusted under 35 U.S.C. 154(b) by 0 days.

(21) Appl. No.: 11/131,032

(22) Filed: May 16, 2005

(65) Prior Publication Data

US 2005/0253609 A1    Nov. 17, 2005

(30) Foreign Application Priority Data

May 14, 2004  (TW) ............................... 93113617 A

(51) Int. Cl.
*G01R 31/02* (2006.01)

(52) U.S. Cl. ...................................... 324/754; 324/755

(58) Field of Classification Search ..................... None
See application file for complete search history.

(56) References Cited

U.S. PATENT DOCUMENTS

2005/0083038 A1*   4/2005   Rothaug et al. ......... 324/158.1

FOREIGN PATENT DOCUMENTS

EP    WO 03/096037 A1 * 11/2003

* cited by examiner

*Primary Examiner*—Vinh Nguyen
*Assistant Examiner*—Russell M. Kobert
(74) *Attorney, Agent, or Firm*—Wei Te Chung

(57) ABSTRACT

A testing apparatus (2) includes a probe station (21), a micropositioner (22), a probe (23), an electronic camera (27), and a monitor. The probe station has a working surface (211) for supporting an object to be tested. The micropositioner is located on the working surface. The probe is mounted on the micropositioner, and is used for testing circuits of the object. The electronic camera is mounted on the micropositioner, and is used for taking images of the probe and the circuits. The monitor connects with the electronic camera, and is used for displaying the images. Because the testing apparatus utilizes the electronic camera to take images of the probes and the circuits, and the images are displayed on the monitor, a user can conveniently observe the testing process. Further, the electronic cameras help reduce the overall cost of the testing apparatus.

11 Claims, 2 Drawing Sheets

TESTING APPARATUS WITH ELECTRONIC CAMERA

FIELD OF THE INVENTION

The present invention relates to testing apparatuses, and particularly to apparatuses utilizing probes to test electrical circuits.

BACKGROUND

In the manufacturing of a modern piece of electronic equipment such as a flat panel display, circuits may be fabricated on a component substrate of the flat panel display. In order to check whether these circuits have open circuits or other defects, the substrate must be tested using a testing apparatus.

FIG. 3 shows a conventional testing apparatus 1. The testing apparatus 1 includes a probe station 11, two micropositioners 12 and 17, a frame 14, a holding arm 15, and a microscope 16.

The probe station 11 includes a working surface 111 and two opposite side surfaces 112. The working surface 111 is a horizontal plane utilized for supporting a substrate (not shown) to be tested. The working surface 111 defines a Z-axis perpendicular to the working surface 111, an X-axis perpendicular to the Z-axis, and a Y-axis perpendicular to the Z-axis and the X-axis. The side surfaces 112 are perpendicular to the working surface 111. Two runners 113 parallel to the Y-axis are defined at the two side surfaces 112, respectively.

The micropositioner 12 is located on the working surface 111 at an edge portion thereof, and includes a probe 13 utilized to test circuits of the substrate. The micropositioner 17 is identical to the micropositioner 12, is placed on the working surface 111 at another edge portion thereof, and includes a probe 18. The micropositioners 12 and 17 can move on the working surface 111 to test circuits at different places of the substrate.

The frame 14 includes two upright poles 141, and a horizontal connecting pole 142 interconnecting the upright poles 141. A bottom end of each upright pole 141 can slide in the corresponding runner 113, so that the frame 14 can move back and forth along the Y-axis. The holding arm 15 is attached on the connecting pole 142, and is utilized to hold the microscope 16. The holding arm 15 can move the microscope 16 back and forth along the connecting pole 142.

In use of the testing apparatus 1, the probes 13 and 18 can work separately or cooperatively. The microscope 16 is used as a tool for a user to observe whether the testing locations of the probes 13 and 18 are correct.

The testing apparatus 1 has some disadvantages. Firstly, because only one microscope 16 is mounted on the probe station 11, the testing locations of both probes 13 and 18 cannot be observed through the microscope 16 at the same time. Secondly, when the size of the substrate is large, the user cannot observe through the microscope 16 and operate the probes 13 and 18 at the same time. Thirdly, the microscope 16 is generally an expensive item that inflates the cost of the testing apparatus 1.

What is needed, therefore, is a testing apparatus which can be conveniently used and which has a relatively low cost.

SUMMARY

A testing apparatus includes a probe station, a micropositioner, a probe, and an electronic camera. The probe station has a working surface for supporting an object to be tested. The micropositioner is located on the working surface. The probe is mounted on the micropositioner and is used for testing one or more circuits of the object. The electronic camera is mounted on the micropositioner and is used for taking images of the probe and the circuits.

Because the testing apparatus utilizes the electronic camera to take images of the probes and the circuits, and the images can be displayed on a monitor, a user can conveniently observe the testing process. In addition, because the electronic camera is generally less expensive than a microscope, the cost of the testing apparatus is lowered.

Other objects, advantages, and novel features will become more apparent from the following detailed description when taken in conjunction with the accompanying drawings, in which:

DETAILED DESCRIPTION OF PREFERRED EMBODIMENTS

Reference will now be made to the drawings to describe a preferred embodiment of the present invention in detail.

Figure 1:
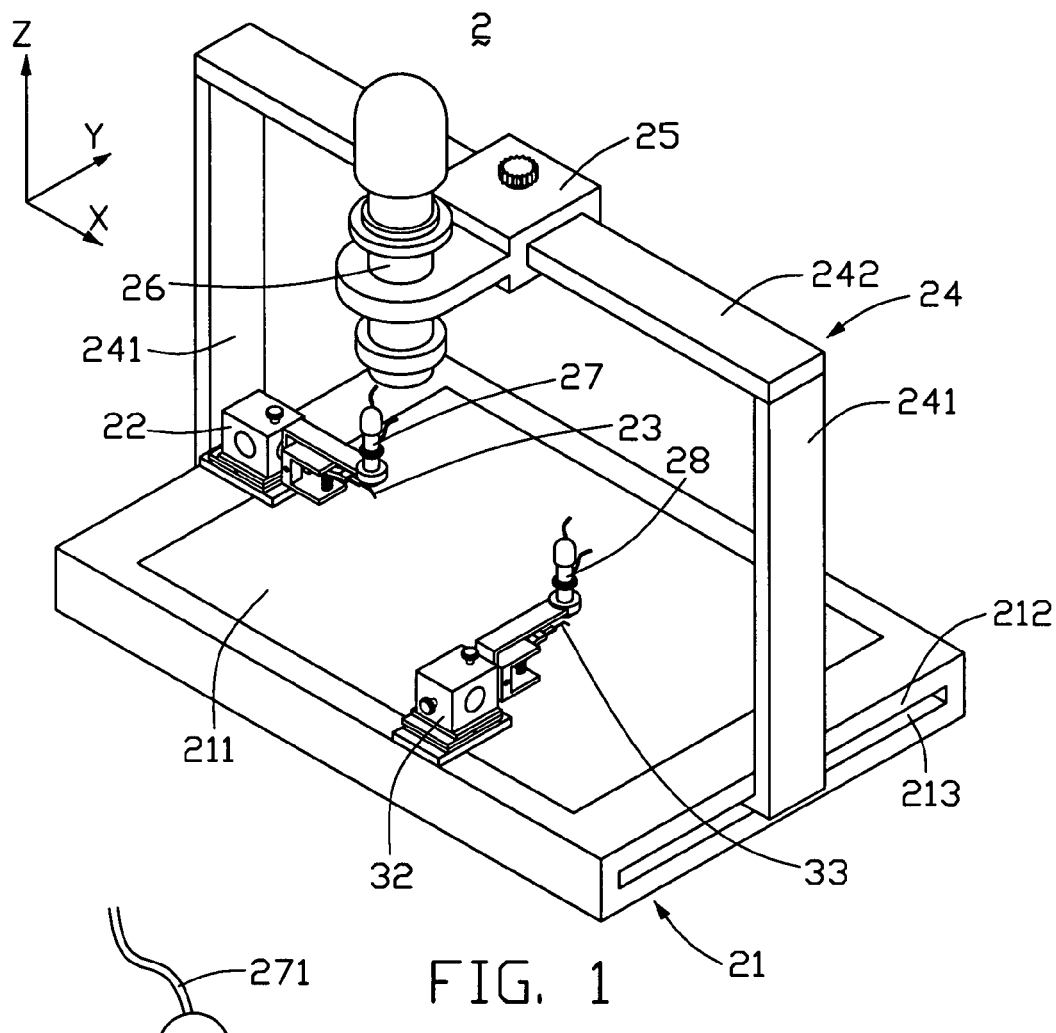
FIG. 1 is an isometric view of a testing apparatus according to a preferred embodiment of the present invention.

Referring to FIG. 1, a testing apparatus 2 in accordance with the present invention includes a probe station 21, two micropositioners 22 and 32, two probes 23 and 33, and two electronic cameras 27 and 28.

The probe station 21 includes a working surface 211 and two opposite side surfaces 212. The working surface 211 is a horizontal plane utilized for supporting a substrate (not shown) to be tested. The working surface 211 defines a Z-axis perpendicular thereto, an X-axis perpendicular to the Z-axis, and a Y-axis perpendicular to the Z-axis and the X-axis. The two side surfaces 212 are perpendicular to the working surface 211. Two runners 213 parallel to the Y-axis are defined at the two side surfaces 212, respectively.

The micropositioner 22 is located at an edge portion of the working surface 211 adjacent one of the side surfaces 212, and includes a probe 23 utilized to test circuits of the substrate. The micropositioner 32 is identical in structure to the micropositioner 22, is located at another edge portion of the working surface 211 between the side surfaces 212, and includes a probe 33. The micropositioners 22 and 32 can move on the working surface 211 to test circuits at different places of the substrate. The electronic camera 27 is mounted on the micropositioner 22, and is utilized to take images of the probe 23 and the circuit tested by the probe 23. The electronic camera 28 is mounted on the micropositioner 32, and is utilized to take images of the probe 33 and the circuit tested by the probe 33.

The testing apparatus 2 further includes a frame 24, a holding arm 25, and an electronic camera 26. The frame 24 includes two upright poles 241, and a horizontal connecting pole 242 interconnecting the upright poles 241. A bottom end of each upright pole 241 can slide in the runner 213, so that the frame 24 in slidably mounted on the probe station 21 and can move back and forth along the Y-axis. The holding arm 25 is attached on the connecting pole 242, and is utilized to hold the electronic camera 26. The holding arm 25 can move the electronic camera 26 back and forth along the connecting pole 242. The electronic cameras 26, 27 and 28 can be charge coupled devices (CCDs).

Figure 2:
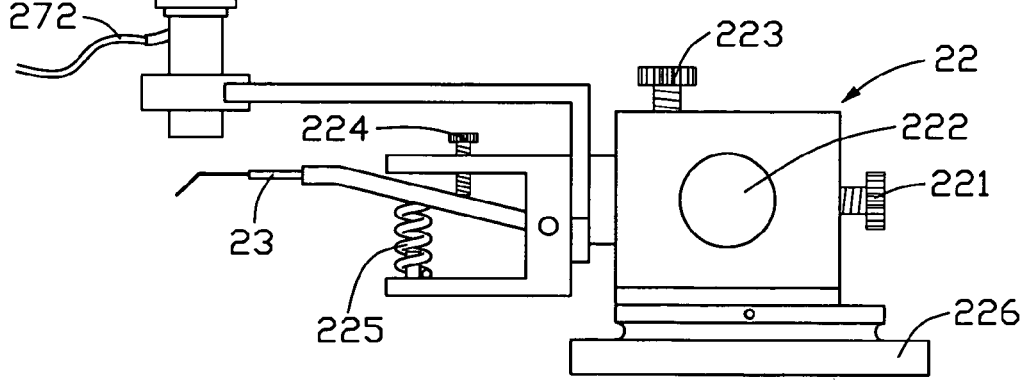
FIG. 2 is a side plan view of a micropositioner and an electronic camera of the testing apparatus of FIG. 1.
Figure 3:
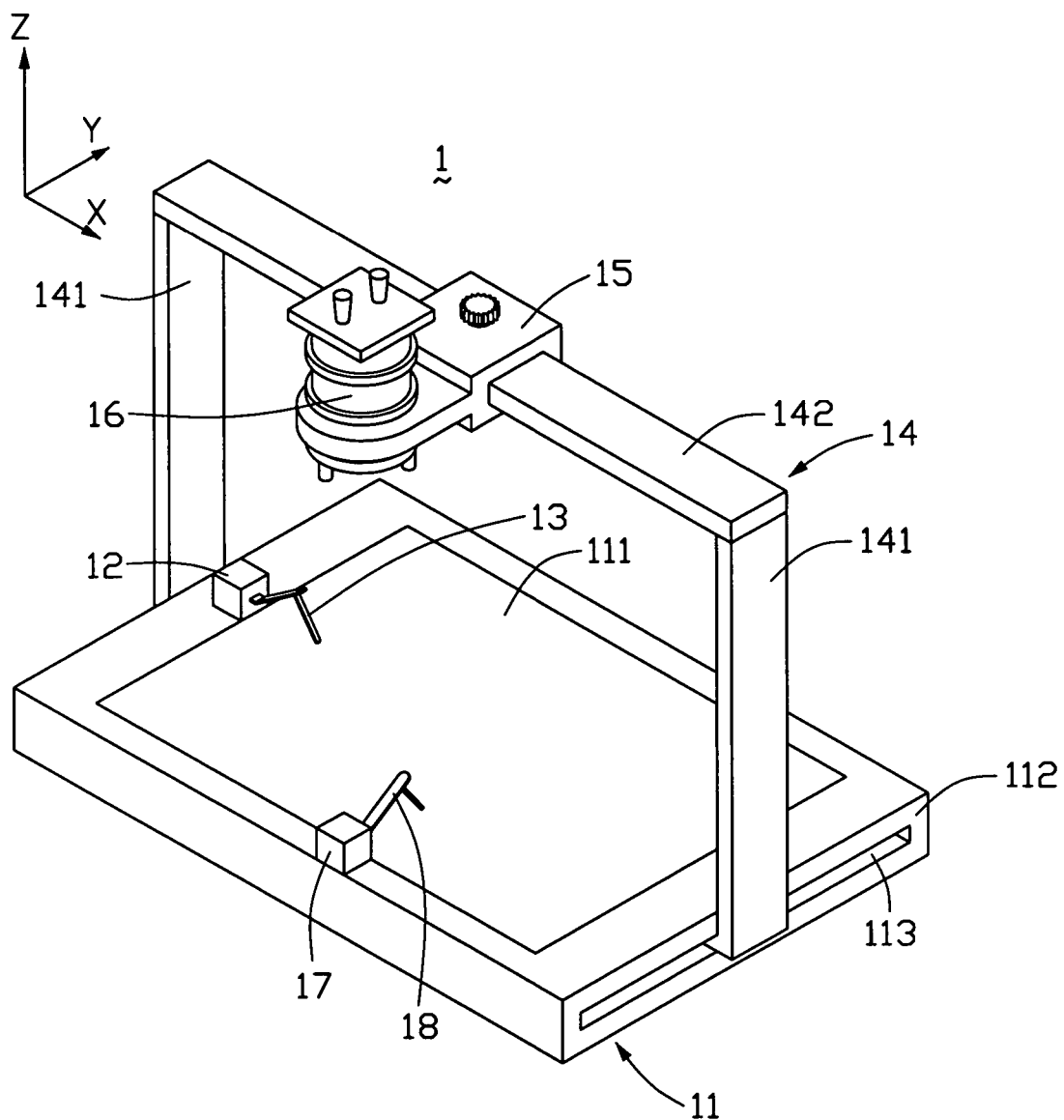
FIG. 3 is an isometric view of a conventional testing apparatus.

Also referring to FIG. 2, a detailed structure of the micropositioner 22 and the electronic camera 27 is shown.

The micropositioner 22 includes a suction cup 226, and four adjusting knobs 221, 222, 223, and 224. The suction cup 226 can be adsorbed on the working surface 211 by vacuum adsorption. The adjusting knob 221 is utilized to adjust the movement of the probe 23 along the X-axis. The adjusting knob 222 is utilized to adjust the movement of the probe 23 along the Y-axis. The adjusting knob 223 is utilized to adjust the movement of the probe 23 along the Z-axis. The adjusting knob 224 cooperates with a spring 225 in adjusting the angle of the probe 23 corresponding to the working surface 211. A light guiding fiber 272 connects the electronic camera 27 and a light source (not shown), and is utilized to guide a light from the light source to inner lenses of the electronic camera 27. A signal wire 271 connects the electronic camera 27 and a signal processing unit (not shown), and is utilized to transmit signals from the electronic camera 27 to the signal processing unit. The signals processed by the signal processing unit can be exported to a monitor (not shown). The monitor is utilized to display images taken by the electronic camera 27.

The structure of the micropositioner 32 is identical to that of the micropositioner 22. The structures of the electronic cameras 26 and 28 are identical to those of the electronic cameras 27. Images taken by the electronic cameras 26 and/or 28 can also be displayed on the monitor.

In use of the testing apparatus 2, the micropositioner 22 is fixed at a certain place on the working surface 211 by the suction cup 226. The images of the probe 23 and the circuit to be tested by the probe 23 are taken by the electronic camera 27, and are displayed on the monitor. The alignment of the probe 23 and the circuit to be tested is displayed. If the probe 23 does not align with the circuit, the adjusting knobs 221, 222, 223, and/or 224 can be adjusted to align the probe 23 with the circuit. Then, the testing work for the circuit can be performed. The micropositioner 32 is used in the same way as the micropositioner 22. The probes 23 and 33 can be operated separately or cooperatively. The electronic camera 26 can take a image of the whole working surface 211, and this image can also be displayed on the monitor.

Because the testing apparatus 2 utilizes the electronic cameras 27 and 28 to take images of the probes 23, 33 and the circuits, and the images are displayed on the same monitor, a user can conveniently observe the testing process. In addition, because the electronic camera 26, 27, 28 are generally less expensive than a conventional microscope, the cost of the testing apparatus 2 is lowered.

In another embodiment, the suction cup 226 can instead be a magnetic foot. Thus, the micropositioner 22 can be fixed on the working surface 211 by magnetic attraction between the magnetic foot and the probe station 21.

It is to be understood, however, that even though numerous characteristics and advantages of the preferred embodiment have been set forth in the foregoing description, together with details of the structure and function of the preferred embodiment, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A testing apparatus comprising:
  a probe station with a working surface for supporting an object to be tested;
  a micropositioner located on the working surface;
  a probe mounted on the micropositioner for testing one or more circuits of the object;
  a first electronic camera mounted on the micropositioner for taking images of the probe and the circuits;
  a frame; and
  a second electronic camera mounted on the frame;
  wherein the frame is movably mounted on the probe station and can move back and forth along a first axis parallel to the working surface.

2. The testing apparatus as claimed in claim 1, further comprising a monitor connecting with the first electronic camera for displaying the images.

3. The testing apparatus as claimed in claim 1, wherein the second electronic camera can move along a second axis parallel to the working surface and perpendicular to the first axis.

4. The testing apparatus as claimed in claim 1, wherein the micropositioner comprises a suction cup absorbed on the working surface by vacuum adsorption.

5. The testing apparatus as claimed in claim 1, wherein the micropositioner comprises a magnetic portion, and the micropositioner can be fixed on the working surface by magnetic attraction between the magnetic portion and the probe station.

6. The testing apparatus as claimed in claim 1, wherein the micropositioner comprises a first adjusting knob, and the first adjusting knob is utilized to adjust movement of the probe along a first axis parallel to the working surface.

7. The testing apparatus as claimed in claim 6, wherein the micropositioner further comprises a second adjusting knob, and the second adjusting knob is utilized to adjust movement of the probe along a second axis, the second axis being parallel to the working surface and perpendicular to the first axis.

8. The testing apparatus as claimed in claim 7, wherein the micropositioner comprises a third adjusting knob, and the third adjusting knob is utilized to adjust movement of the probe along a third axis, the third axis being perpendicular to the working surface.

9. The testing apparatus as claimed in claim 1, wherein the micropositioner comprises an angle adjusting knob for adjusting an angle of the probe relative to the working surface.

10. A testing apparatus comprising:
  a probe station with a working surface for supporting an object to be tested;
  a micropositioner located on and moveable relative to the working surface;
  a probe mounted on the micropositioner for testing one or more circuits of the object;
  an electronic camera mounted on the micropositioner for taking images of the probe and the circuits;
  a device displaying the images in a specific form;
  a frame having a second electronic camera mounted thereon, wherein the frame is movably mounted on the probe station and can move back and forth along a first axis parallel to the working surface.

11. A method of testing comprising steps of:
  providing a probe station with a working surface for supporting an object to be tested;
  providing a micropositioner located on the working surface;
  providing a probe mounted on the micropositioner for testing one or more circuits of the object;
  providing an electronic camera mounted on the micropositioner for taking images of the probe and the circuits;
  providing a frame movably mounted on the probe station;
  providing a second electronic camera mounted on the frame; and
  moving the frame either back forth or both back and forth along a first axis parallel to the working surface.

* * * * *